US009741629B2

(12) United States Patent  
Usui et al.

(10) Patent No.: US 9,741,629 B2  
(45) Date of Patent: Aug. 22, 2017

(54) PLASMA PROCESSING APPARATUS AND PLASMA PROCESSING METHOD

(71) Applicant: Hitachi High-Technologies Corporation, Minato-ku, Tokyo (JP)

(72) Inventors: Tatehito Usui, Tokyo (JP); Kosa Hirota, Tokyo (JP); Satomi Inoue, Tokyo (JP); Shigeru Nakamoto, Tokyo (JP); Kousuke Fukuchi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/852,189

(22) Filed: Sep. 11, 2015

(65) Prior Publication Data

US 2016/0284610 A1    Sep. 29, 2016

(30) Foreign Application Priority Data

Mar. 26, 2015  (JP) ................. 2015-063603

(51) Int. Cl.
| | |
|---|---|
| *H01L 21/3065* | (2006.01) |
| *H01L 21/308* | (2006.01) |
| *H01L 21/66* | (2006.01) |
| *H01J 37/32* | (2006.01) |
| *H01L 21/67* | (2006.01) |

(52) U.S. Cl.
CPC ........ *H01L 22/20* (2013.01); *H01J 37/32926* (2013.01); *H01J 37/32963* (2013.01); *H01J 37/32972* (2013.01); *H01L 21/308* (2013.01); *H01L 21/3065* (2013.01); *H01L 22/12* (2013.01); *H01L 21/67253* (2013.01)

(58) Field of Classification Search
None
See application file for complete search history.

(56) References Cited

U.S. PATENT DOCUMENTS

| 4,675,072 A * | 6/1987 | Bennett .............. G01N 21/6402 |
| | | 156/345.25 |
| 6,824,813 B1 * | 11/2004 | Lill ....................... C23C 16/401 |
| | | 118/665 |
| 2003/0211738 A1 * | 11/2003 | Nagata ................ H01L 21/3065 |
| | | 438/689 |

FOREIGN PATENT DOCUMENTS

| JP | 2001-085388 A | 3/2001 |
| JP | 2002-081917 A | 3/2002 |

(Continued)

*Primary Examiner* — Shamim Ahmed  
(74) *Attorney, Agent, or Firm* — Miles & Stockbridge P.C.

(57) ABSTRACT

A plasma processing method of processing layer structure previously formed on an upper surface of a wafer disposed in a processing chamber within a vacuum container and having a layer to be processed and an undercoating layer disposed under the layer by plasma in the processing chamber, includes a step of calculating an etching amount of the layer to be processed at time during processing of any wafer by using result of comparing real pattern data with detection pattern data obtained by combining two patterns of intensity having as parameter wavelength of interference light obtained by processing the layer structure containing three or more undercoating layers having different thickness and the layer to be processed in advance of the processing of the any wafer and a real pattern of intensity having as parameter the wavelength of the interference light obtained during processing of the layer structure on the any wafer.

6 Claims, 10 Drawing Sheets

(56) References Cited

FOREIGN PATENT DOCUMENTS

| JP | 2003-083720 A | 3/2003 |
|----|---------------|--------|
| JP | 2010-034582 A | 2/2010 |

* cited by examiner

FIG.2
(a)
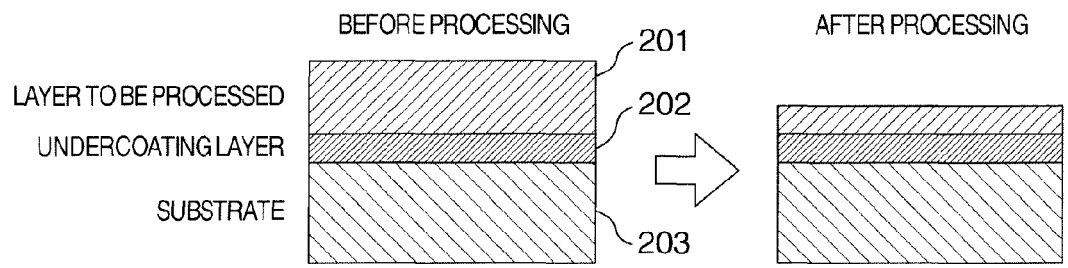
(b)
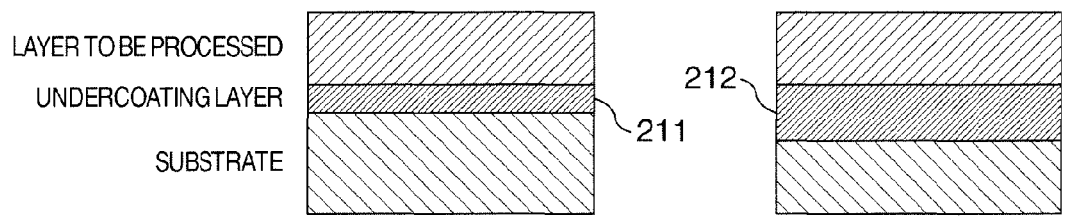
(c)
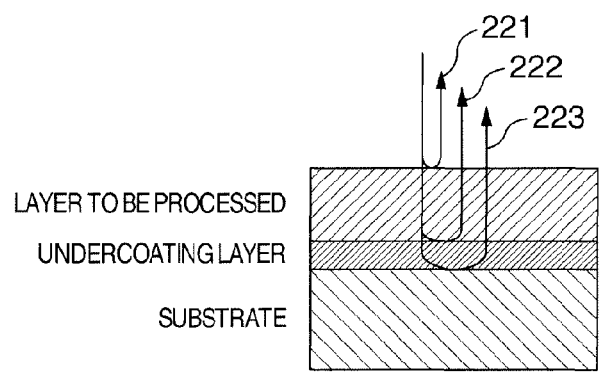

FIG.3
(a)
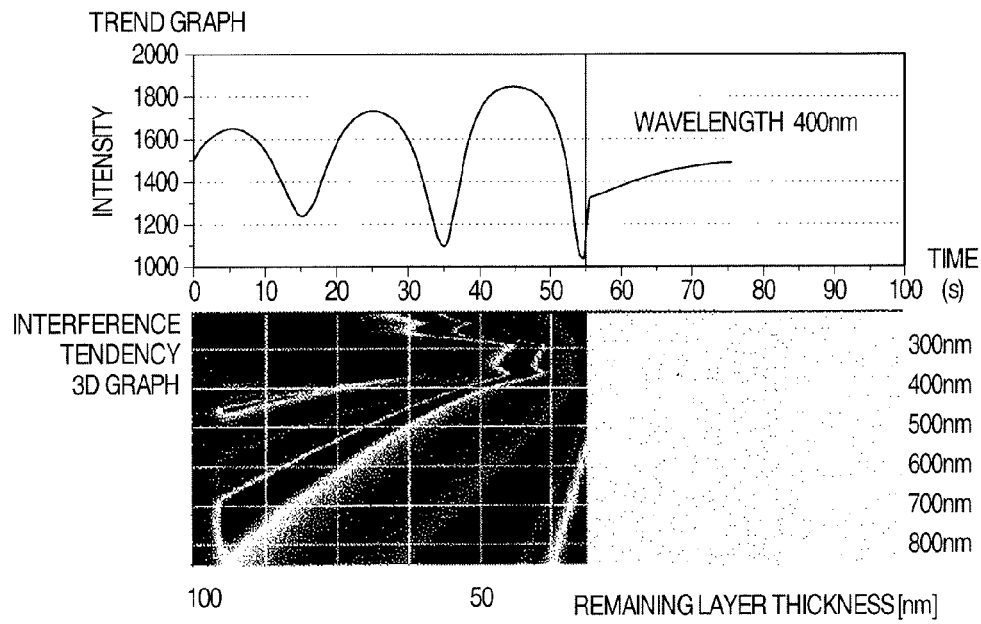
(b)
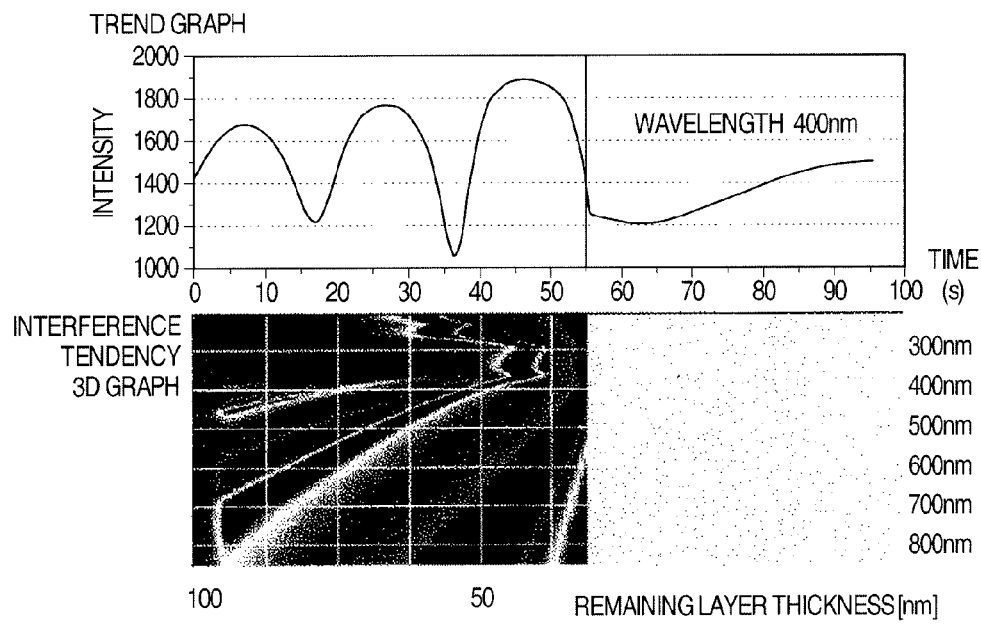

FIG.9
(a)
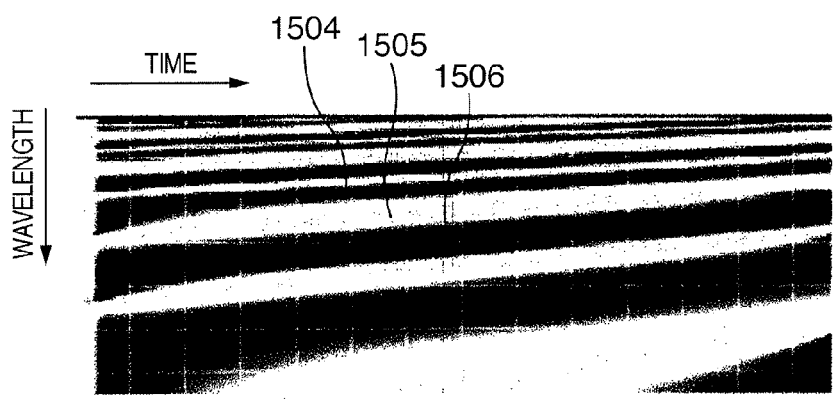
(b)
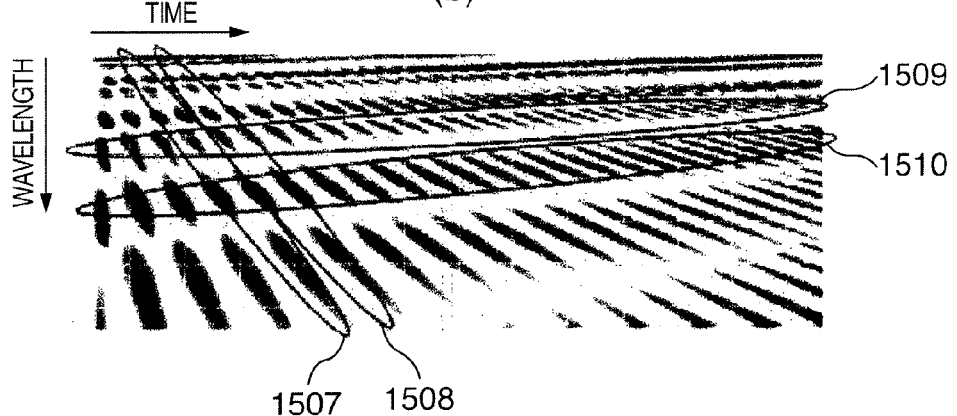
(c)
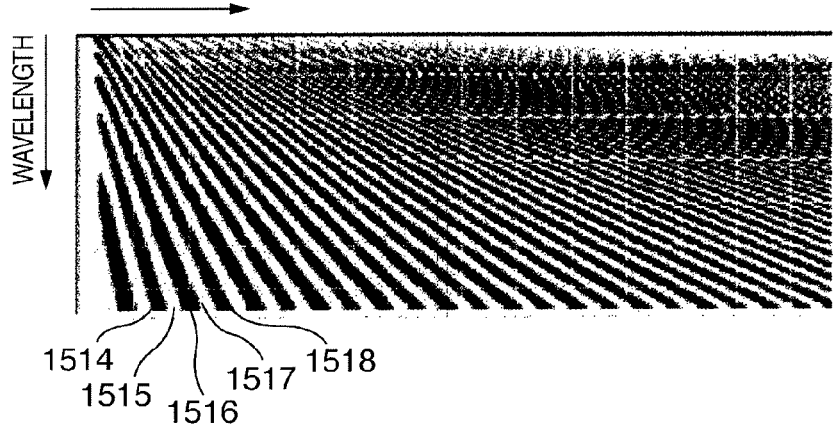

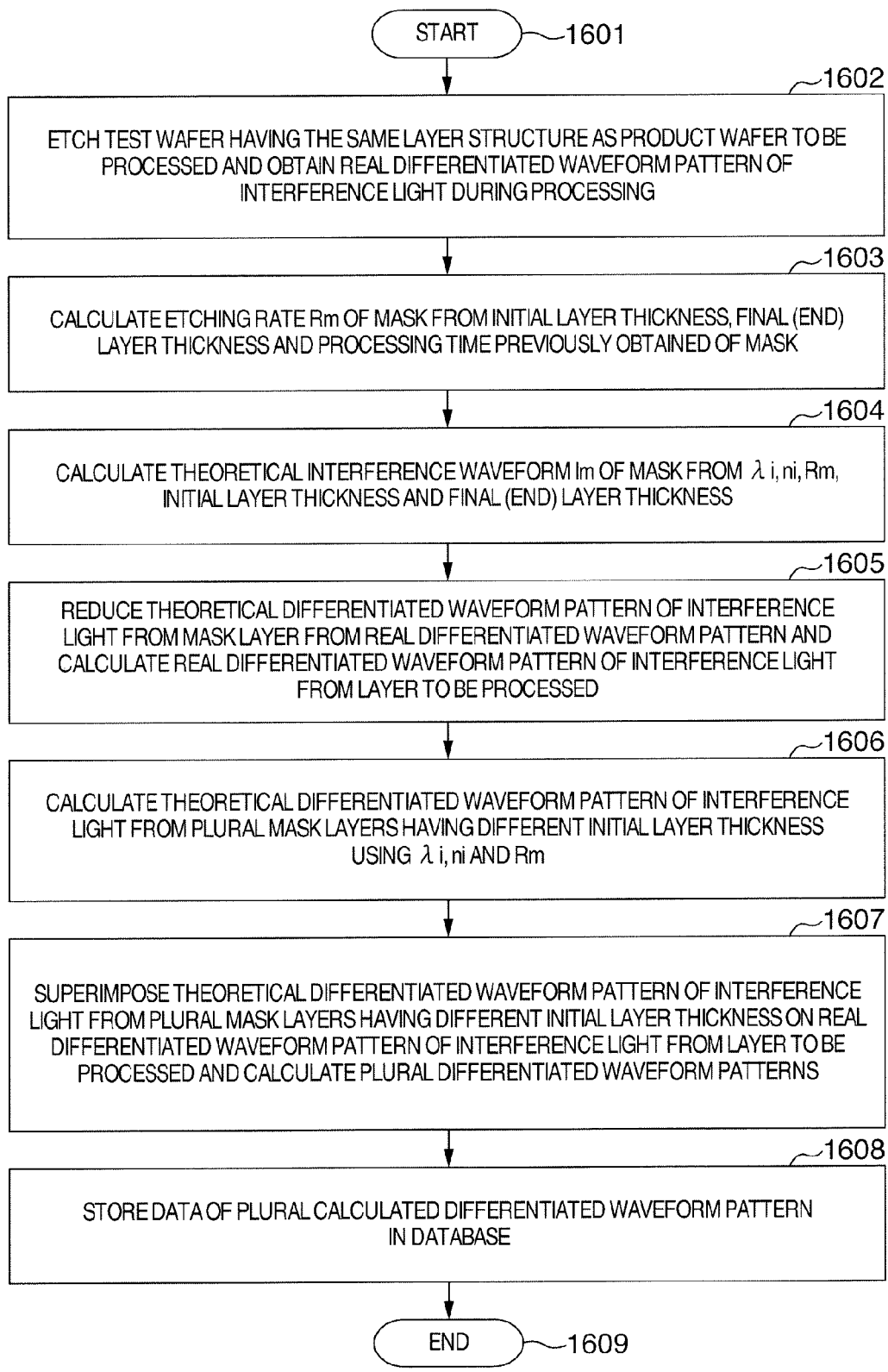

PLASMA PROCESSING APPARATUS AND PLASMA PROCESSING METHOD

BACKGROUND OF THE INVENTION

The present invention relates to a plasma processing apparatus or a plasma processing method of detecting an etching end point at the time that a substrate-like sample is etched in fabrication of a semiconductor integrated circuit and more particularly to a plasma processing apparatus and a plasma processing method of performing etching processing of a layer structure containing a layer to be processed previously provided on an upper surface of the substrate-like sample such as a semiconductor wafer disposed in a processing chamber within a vacuum container by means of plasma formed in the processing chamber while detecting the processing state.

In the process of fabricating a semiconductor device from a substrate-like sample such as a semiconductor wafer, the dry-etching technique using plasma formed in a processing chamber within a vacuum container is widely used to remove a film layer of various materials, particularly the film layer of dielectric material, formed on the surface of the wafer or form a pattern in the layer. In an etching processing apparatus using such plasma, generally, an electric field or magnetic field is made to operate on processing gas introduced in the processing chamber which is a processing space within the vacuum container to form plasma, so that charged particles such as ions in the obtained plasma or high-active particles (radicals) are reacted with the layer structure containing the film layer to be processed previously disposed on the surface of the wafer to thereby make etching of the layer to be processed.

In such etching processing of the wafer, it is known that the strength of the specific wavelength in emitted light of the formed plasma is changed with the etching progress of the layer to be processed. Thus, there is hitherto known the technique that the change in the light emission intensity of the specific wavelength from the plasma in such processing is detected during the processing and the end point of etching in case where the layer is removed by the etching or a desired depth is reached is detected on the basis of the detection result.

Particularly, in order to achieve higher integration degree and minuteness of processing of a semiconductor device, it is important that processing is ended when remaining thickness of the layer to be processed reaches a predetermined value in the etching processing. As such a technique of ending the etching processing when the thickness of the layer to be processed reaches the predetermined value, there is known the technique that the thickness of the remaining layer is detected using change in the intensity of interfered light (interference light) by utilizing the fact that light from the surface of a wafer containing the layer to be processed forms the interfered waveform in accordance with reduction in the remaining thickness of the layer to be processed with the progress of etching.

Further, there is the process that a silicon substrate is etched and a groove for electrically separating a device on the wafer is formed in the silicon, for example, after application of mask material on the wafer. In this case, it is important that when the silicon substrate is etched by a decided depth amount, the processing is ended.

For example, JP-A-2001-085388 discloses that wavelengths of at least two kinds of interference light are detected and the remaining thickness of the layer to be processed is detected using values of the intensity of the interference light of the plural wavelengths. Further, JP-A-2002-081917 discloses the technique that the interference light of plural wavelengths is detected and patterns of data concerning the intensity of the interference light having previously obtained interference light of plural wavelengths as parameter are compared with data concerning the intensity of actually obtained interference light to thereby detect the remaining thickness of the layer to be processed.

Moreover, JP-A-2010-034582 discloses the method in which known light is received from the outside and three wavelengths of light reflected by a wafer are observed to analyze a frequency so that the depth of etching is calculated. JP-A-2003-83720 discloses the method in which interference light of plasma light reflected by member to be processed is observed and interference wavelengths are separated into a mask component and a step component for wavelength bands to calculate the depth of etching.

SUMMARY OF THE INVENTION

The above prior-art techniques do not consider the following points sufficiently and accordingly problems arise.

For example, it is known that an oxide layer formed by LPCVD (Low Pressure Chemical Vapor Deposition) has the low reproducibility of the thickness of the layer and the reproducibility is about 10%. On the other hand, in the etching process, even if the thickness of the layer to be processed is scattered as above, change in intensity of the interference light according to the absolute value of the remaining layer thickness can be detected, so that the remaining thickness of the layer to be processed can be detected with high accuracy in the techniques disposed in JP-A-2001-085388 and JP-A-2002-081917.

However, when the undercoating layer which is a lower layer of the layer to be processed is made of material which transmits light and the thickness thereof is widely scattered in each sample, the intensity of the interference light obtained in each wafer is different even if the remaining thickness of the layer to be processed is the same and accordingly there arises a problem that the remaining thickness of the layer to be processed cannot be detected exactly. Such a problem is not considered in the above technique.

It is a first object of the present invention to provide a plasma processing apparatus and a plasma processing method in which the remaining thickness of a layer to be processed is detected accurately during the etching processing using plasma to improve the yield of the processing.

Further, in order to separate devices formed on a wafer, it is important to etch silicon by predetermined depth so as to form a groove in the silicon and end the processing.

However, in JP-A-2010-034582, there arises a problem in the following point. It is considered that light reflected by the wafer interferes with only the surface layer of the layer to be etched (silicon) and the etching bottom. Actually, light is reflected even by the surface layer of a resist mask, for example, formed on the upper part of silicon and accordingly it is necessary to consider an amount of remaining layer of the resist mask. Therefore, this method cannot detect the depth of the layer to be etched (silicon) exactly.

Further, in JP-A-2003-83720, there arises a problem in the following point. For example, when the interference waveform of a mask component overlaps with the interference waveform of a step component in all wavelengths, the mask component and the step component cannot be separated in the wavelength band. Accordingly, there is a case where this method cannot detect the depth of the layer to be etched (silicon) exactly.

It is a second object of the present invention to provide a plasma processing apparatus or a plasma processing method in which influence from mask material formed on a substrate is reduced to detect the etching amount with high accuracy and improve the yield of processing.

In order to achieve the above object, the plasma processing method of processing layer structure previously formed on an upper surface of a wafer disposed in a processing chamber within a vacuum container and having a layer to be processed and an undercoating layer disposed under the layer to be processed by means of plasma formed in the processing chamber, comprises a step of calculating an etching amount of the layer to be processed at time during processing of any wafer by using result of comparing real pattern data with detection pattern data obtained by combining two patterns of intensity having as parameter wavelength of interference light during the processing obtained by processing the layer structure containing three or more undercoating layers having different thickness and the layer to be processed in advance of the processing of the any wafer and a real pattern of intensity having as parameter the wavelength of the interference light obtained from the layer to be processed during processing of the layer structure on the any wafer and a step of judging arrival at a target of the processing of the layer to be processed using the etching amount.

The remaining layer thickness of the member to be processed can be detected exactly in consideration of influence of the undercoating layer formed under the member to be processed. Further, the depth of the member to be processed can be detected exactly in consideration of influence of the mask member formed on the member to be processed. Moreover, the thickness of the undercoating layer and the initial thickness of the mask member can be managed to be fed back to the CVD process in the previous process.

Other objects, features and advantages of the invention will become apparent from the following description of the embodiments of the invention taken in conjunction with the accompanying drawings.

BRIEF DESCRIPTION OF THE DRAWINGS

FIG. 2(a)-(c) is diagrams schematically illustrating layer structures on wafers to be etched by the plasma processing apparatus shown in FIG. 1;

FIG. 3(a)-(b) includes graphs showing the relation of an intensity of interference light and thickness of an undercoating layer according to the layer structures shown in FIG. 2(a)-(c);

FIG. 9(a)-(c) is graphs showing differentiated waveform patterns obtained in case where a wafer having the layer structure shown in FIG. 7(a)-(b) is etched by means of the plasma processing apparatus according to the modification example shown in FIG. 6; and FIG. 10 is a flow chart showing an operation flow for calculating a real step differentiated waveform pattern by calculating a theoretical differentiated waveform pattern of interference light from a mask layer and subtracting data corresponding to the theoretical differentiated waveform pattern from data of the real differentiated waveform pattern of the interference light from the layer structure.

BRIEF DESCRIPTION OF THE EMBODIMENTS

Embodiments of the present invention are now described with reference to the drawings.

Embodiment 1

The first embodiment of the present invention is now described with reference to FIGS. 1 to 5.

Figure 1:
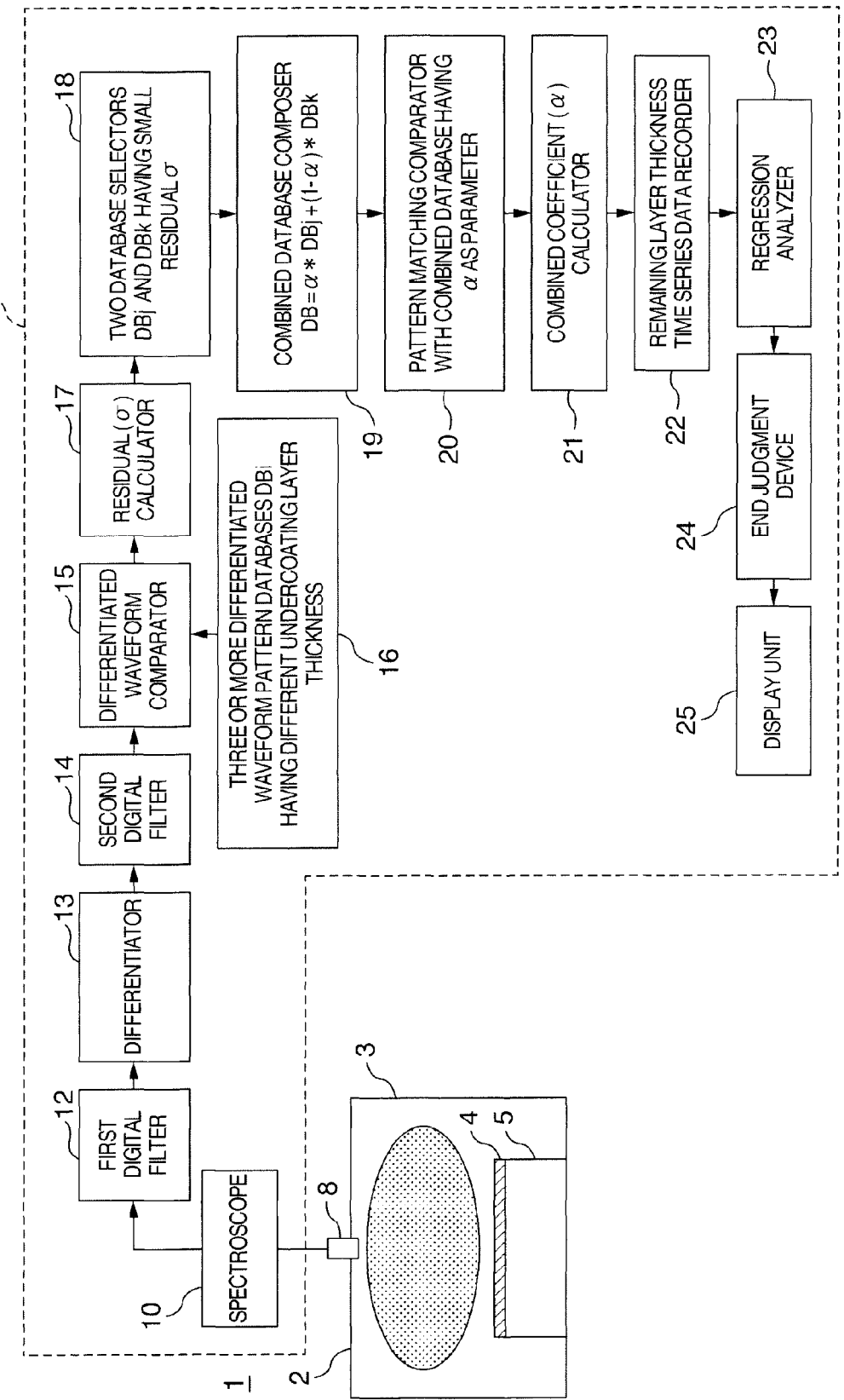
FIG. 1 is a diagram schematically illustrating a plasma processing apparatus according to a first embodiment of the present invention.

A plasma processing apparatus 1 according to the first embodiment of the present invention is illustrated in FIG. 1. FIG. 1 is a diagram schematically illustrating the plasma processing apparatus according to the embodiment of the present invention.

The plasma processing apparatus includes a vacuum processing chamber 2 disposed within a vacuum container. Further, although not shown, the lower part of the vacuum container is coupled with an exhaust device having a vacuum pump such as a turbomolecular pump. Moreover, a coaxial cable and an antenna for supplying high-frequency power or electric field generation means such as a wave guide for propagating microwave or magnetic field generation means such as solenoid coil is disposed above and around the cylindrical vacuum container so as to be able to supply electric field or magnetic field in the vacuum processing chamber 2 although not shown.

An outer side wall of the vacuum container of the plasma processing apparatus 1 of the embodiment is coupled with a vacuum conveyance container which is another vacuum container not shown and a wafer 4 to be processed is conveyed between the outer side wall and a conveyance chamber which is an inner space in which pressure is reduced in the vacuum conveyance container. Further, a cylindrical sample stage 5 on which the wafer 4 is put is disposed at the center part in the lower part of the vacuum processing chamber 2. Moreover, the vacuum container is coupled with a gas feeding pipe not shown and the gas feeding pipe communicates with plural gas introduction holes disposed in the upper part or a ceiling surface of the vacuum chamber 2.

In such a plasma processing apparatus 1, the wafer 4 which is a sample is put on a pointed end of an arm of a conveyance robot installed in the vacuum conveyance container and is conveyed within the conveyance room. The arm is extended so that wafer enters into the vacuum processing chamber 2 through a gate which is an opening disposed in the side wall of the vacuum container and the wafer is brought above the sample stage 5 disposed in the vacuum processing chamber 2 to be delivered thereon. Thereafter, the robot arm is contracted to be withdrawn from the vacuum processing chamber 2 and the gate is hermetically closed from the outside of the vacuum processing chamber 2 by means of a gate valve not shown, so that the inside of the vacuum processing chamber 2 is sealed hermetically.

Furthermore, the wafer 4 is chucked onto the upper surface formed of dielectric of the sample stage 5 which is a mounting plane by static electricity to be held thereon. Heat transmission gas such as He is fed between the back side of the wafer 4 and the mounting plane of the sample stage 5 to accelerate heat transmission between the wafer 4 and the sample stage 5.

The process gas supplied through the gas feeding pipe coupled with a gas source from the gas introduction holes is introduced in the vacuum processing chamber 2 and the inside of the vacuum processing chamber 2 is evacuated by operation of the exhaust device to be decompressed to the pressure at the degree of vacuum suitable for processing of the substrate-like sample such as the semiconductor wafer by the balance of quantitative velocities of supply and exhaust of gas. In this state, an electric field or a magnetic field is supplied in the vacuum processing chamber 2 by electric field or magnetic field generation means to excite particles of the process gas, so that plasma 3 is formed. The layer structure formed by lamination of plural layers previously formed on the upper surface of the wafer 4 put on the sample stage 5 is etched by charged particles contained in the plasma 3 or particles (active particles) having high reactivity.

The excited particles contained in the plasma 3 emit the increased energy as light and accordingly the plasma 3 emits light. A light receiving device 8 having a transparent member and receiving light emitted from the plasma to detect the light is disposed on the ceiling surface above the vacuum processing chamber 2 in the upper part of the vacuum container. The emitted light of the plasma 3 is directly received by the light receiving device 8 or is reflected by the upper surface of the wafer to be then received by the light receiving device 8 and is transmitted as a signal to an etching amount detection device 9 which is electrically or optically coupled or connected to the light receiving device 8.

Referring now to FIG. 2, a typical example of the layer structure to be etched in the embodiment is described. FIG. 2 is diagrams schematically illustrating layer structures on wafers to be etched by the plasma processing apparatus shown in FIG. 1.

As shown in (a) of FIG. 2, the layer structure to be processed in the embodiment includes a polysilicon layer 201 which is a layer to be processed, an undercoating layer 202 which is an oxide layer disposed under the polysilicon layer 201 in contact with the polysilicon layer 201 and a silicon substrate 203. Light incident on the layer structure having such structure from the plasma is reflected by the boundaries or the interfaces between the layers to produce the reflected light. The reflected light includes reflected light 221 reflected by the surface of the polysilicon layer 201, reflected light 222 reflected by the boundary between the polysilicon layer 201 and the undercoating layer 202 and reflected light 223 reflected by the boundary between the undercoating layer 202 and the silicon substrate 203.

Optical path differences are produced among these reflected lights and accordingly interference light is formed. Further, since the layer thickness of the polysilicon layer 201 which is the layer to be processed is reduced with the progress of the etching, the optical path differences of the reflected lights are changed to generate interference phenomena having change in the intensity of different period for each wavelength of the light.

The interference light having the change in the intensity as above is transmitted to a spectroscope 10 of the etching amount detection device 9 through the light receiving device 8 disposed to face the plasma 3 in the upper part of the vacuum processing chamber 2 of FIG. 1. The etching amount detection device 9 detects the value of the intensity of the interference light and the amount of change in the intensity from the signal according to the transmitted interference light and judges the etching amount such as the etching depth and the remaining layer thickness of the polysilicon layer 201 which is the layer to be processed and arrival at the processing end on the basis of the detection result.

As shown in FIG. 1, the etching amount detection device 9 of the embodiment includes the spectroscope 10, a first digital filter 12, a differentiator 13, a second digital filter 14, a differentiated waveform comparator 15, three or more differentiated waveform pattern databases 16 for different undercoating layer thickness, a residual calculator 17 for calculating a residual σ by the differentiated waveform comparator, a database selector 18 for selecting two pattern databases DBj and DBk having small residual calculated by the calculator 17, a combined database composer 19 for combining databases to be combined from the selected databases, a pattern matching comparator 20 for making pattern matching with the combined database having α as a parameter, a combination coefficient calculator 21 for calculating a combination coefficient α having the minimum residual, a remaining layer thickness time series data recorder 22 for calculating instantaneous remaining layer thickness of the layer to be processed on the basis of outputs of the calculator 21 and the pattern matching comparator 20 and recording the calculated instantaneous remaining layer thickness in time series, a regression analyzer 23 for calculating a current value of the remaining layer thickness using the time series data of the remaining layer thickness recorded by the remaining layer thickness time series data recorder 22, an end judgment device 24 for judging the etching end from the current remaining layer thickness and a display unit 25 for displaying a judgment result of the end judgment device 24.

Further, the etching amount detection device 9 of the embodiment may be composed of detection units containing semiconductor devices such as microprocessors each performing each of plural functions and connected by wired or wireless communication lines or may be composed of one semiconductor device capable of performing the plural functions except the display unit 25. The detection units containing the semiconductor devices include arithmetic and control units such as microprocessors, communication interfaces for making communication of signal with the outside and storage units such as RAM and ROM or hard disk drive and CD-ROM drive in which signals, data and software are stored, which are connected to be able to make communication with one another.

The emitted light of the plasma 3 formed in the vacuum processing chamber 2 is reflected by the upper surface of the wafer 4 and transmitted to the spectroscope 10 through the light receiving device 8. The spectroscope 10 which has received the signal from the light receiving device 8 separates the interference light signals into predetermined frequencies and converts the intensities of the respective wavelengths into digital signals to be outputted.

Plural specific wavelength signals outputted from the spectroscope 10 as sampling signals at any time during processing of the wafer 4 are stored as time series data $y_{ij}$ in the storage unit such as RAM not shown. The time series data yij are transmitted to the first digital filter 12 to be smoothed and are stored in the storage unit such as RAM as smoothed time series data Yij.

Next, the smoothed time series data Yij are transmitted to the differentiator 13 in which time series data dij which are time-differentiated (differential coefficients) values (primary or secondary differentiated values) are calculated to be stored in the storage unit such as RAM. The time series data dij of the differential coefficients are smoothed by the second digital filter 14 and stored in the storage unit such as RAM as the smoothed differential coefficient time series data Dij. Thus, a differentiated waveform pattern (real pattern) (wavelength is used as parameter) showing the wavelength dependence of the differentiated value of the intensity of the interference light is calculated from the smoothed differential coefficient time series data Dij.

Here, calculation of the smoothed differential coefficient time series data Di is described. In the embodiment, a secondary Butterworth low-pass filter is used as the digital filter circuit 12, for example. The time series data Yi smoothed by the secondary Butterworth low-pass filter is calculated by the expression (1):

$$Y_i = b1 \cdot y_i + b2 \cdot y_{i-1} + b3 \cdot y_{i-2} - [a2 \cdot Y_{i-1} + a3 \cdot Y_{i-2}] \quad (1)$$

where coefficients b and a have numerical values different depending on a sampling frequency and a cut-off frequency. The coefficient values of the digital filter in the embodiment are, for example, a2==1.143, a3=0.4128, b1=0.067455, b2=-0.013491 and b3=0.067455 (sampling frequency 10 Hz and cut-off frequency 1 Hz). The time series data di of the secondary differential coefficient is calculated by the differentiator 13 from the expression (2) using the polynomial adaptation smoothing differential method of the time series data Yi at 5 points as follows:

$$d_i = \Sigma_{j=-2}^{j=2} wj \cdot Y_{i+j} \quad (2)$$

where weight coefficients w are w-2=2, w-1=-1, w0=-2, w1=-1, h, and w2=2. The time series data di of the differential coefficient is used to calculate the smoothed differential coefficient time series data Di from the expression (3) by the secondary Butterworth low-pass filter, for example, as the digital filter circuit 14 as follows:

$$D_i = b1 \cdot d_i + b2 \cdot d_{i-1} + b3 \cdot d_{i-2} - [a2 \cdot D_{i-1} + a3 \cdot D_{i-2}] \quad (3)$$

The data value DBi of a pattern having as a parameter a waveform of a differentiated value showing change in the intensity of the interference light corresponding to remaining layer thickness amount (remaining layer amount) during the etching processing of polysilicon which is the layer to be processed for measurement of the etching amount disposed above the oxide layer of the undercoating layer having a predetermined layer thickness is stored in the differentiated waveform pattern database 16 in advance of the processing of the wafer 4. In the differentiated waveform comparator 15, a real pattern value which is a pattern having as a parameter the waveform of the differentiated value of the intensity according to the interference light obtained actually during the processing of the wafer 4 is compared with the differentiated waveform pattern data value DBi stored in the differentiated waveform pattern database 16, so that the residual value σ between both the patterns is calculated.

For example, a waveform of change caused by change of the remaining layer thickness value of the differentiated value of the intensity of the interference light at the same waveform (it is regarded that this corresponds to the time after the beginning of the processing) is calculated as a difference between the pattern data DBi and the real pattern for each remaining layer thickness and this is calculated for the whole of the predetermined wavelength band or plural specific wavelengths. These can be detected as a residual value pattern of both.

The differentiated waveform pattern stored in the differentiated waveform pattern database 16 and registered as used for detection of the remaining layer thickness uses three or more patterns of the differentiated value having as a parameter the wavelength of the intensity of the interference light for the remaining layer thickness amount (remaining layer amount) of the layer to be processed when the oxide layer 202 having an upper limit and lower limit of the layer thickness of the oxide layer 202 which is the undercoating layer scattered within any range or the oxide layer 202 having the layer thickness near thereto and the layer structure of polysilicon which is the layer to be processed for measurement of the etching amount disposed above the oxide layer 202 are processed at the same condition as the condition at the time that the layer structure containing the mask layer on the actual wafer subjected to the processing process for mass-producing the semiconductor device is etched. That is, at least three patterns having different undercoating layer of the differentiated value of the intensity having as a parameter the wavelength of the interference light used to detect the remaining layer thickness are previously registered and recorded as the data value DBi in the media such as RAM and ROM constituting the differentiated waveform pattern database 16 or a storage unit such as a hard disk or a storage unit such as DVD-ROM before the beginning of the processing and the patterns are used to calculate the residual between the patterns and the real pattern in the calculator 17.

On the other hand, (b) of FIG. 2 shows sections of wafers having different thickness of undercoating layers 211 and 212 which are oxide layers. It is known that the oxide layer formed by LPCVD (Low Pressure Chemical Vapor Deposition) has the low reproducibility of the layer thickness and the reproducibility is said to be about 10%.

When the layer thickness of the oxide layers 211 and 212 which are the undercoating layers is different as above, there arises a problem. When the layer thickness of the undercoating layers 211 and 212 which are oxide layers is different even if the remaining layer amount of polysilicon which is the layer to be processed is the same, the optical path differences of light 223 reflected by the boundary between the undercoating layer and the substrate and other reflected lights 221 and 222 are different as shown in (c) of FIG. 2. In the interference, since the maximum and the minimum of the intensity of the interference light are decided by the optical path differences, the intensity of the interference light is different even for the thickness of the same polysilicon layer 201 and it is difficult to detect the layer thickness on the basis of the intensity of the interference light with high accuracy.

FIG. 3 shows patterns (differentiated waveform patterns) in which change in the differentiated value of the intensity having as a parameter the wavelength of the interference light from the polysilicon layer for change of the remaining layer thickness of the polysilicon layer is expressed by shading of magnitude of change for cases where the thicknesses of the undercoating layers are 40 nm and 80 nm. (a) of FIG. 3 shows change in the intensity of the interference light at the wavelength 400 nm in case where the thickness of the undercoating layer is 40 nm and a differentiated waveform pattern in the range of wavelength of 250 nm to 850 nm. (b) of FIG. 3 shows change in the intensity of the interference light at the wavelength 400 nm in case where the thickness of the undercoating layer is 80 nm and a differentiated waveform pattern in the range of wavelength of 250 nm to 850 nm.

In the drawings of the differentiated waveform pattern, the wavelength [nm] is taken in the vertical axis and the remaining layer thickness (regarded as corresponding to time after beginning of processing) is taken in the horizontal axis. These drawings are graphs showing the relation of the intensity of the interference light and the thickness of the undercoating layer in the layer structure shown in FIG. 2.

As shown in FIG. 3, when the layer thickness of the undercoating oxide layer is different, change in the intensity of the interference light is different. In the minimum value of the intensity of the interference light, the remaining layer thickness of the polysilicon layer is different in the wafer having the different layer thickness of the undercoating oxide layer. This means that the judgment accuracy is deteriorated by the layer thickness of the undercoating oxide layer in the device for judging the remaining layer thickness by utilizing the light interference.

In the embodiment, the differentiated waveform database containing the pattern of the differentiated value of the intensity having as a parameter the wavelength of the interference light obtained from the polysilicon layer in the case where plural layer structures having different layer thickness of the undercoating oxide layer 202 and other structure being equal or closely resembled to the degree regarded as the other structure are disposed above the oxide layer 202 and the polysilicon layer for measuring the etching amount to be processed are etched under the same condition as the condition in case where the layer structure including the mask layer on the actual wafer to be subjected to the processing process for mass-producing the semiconductor device is etched is stored and held in the differentiated waveform pattern database 16. When the actual layer structure on the wafer is processed for the mass production, data stored in the databases are combined as the basic database to compose pattern data or the database thereof newly and the pattern data is used for detection of the thickness of the layer to be processed of the actual layer structure, so that even if the thickness of the undercoating oxide layer 202 is scattered, the layer thickness of the polysilicon layer 201 to be processed disposed above or the end point can be judged with accuracy.

Hereinafter, in the embodiment, the structure in which the pattern data stored in the differentiated waveform database in accordance with the oxide layers 211 and 212 having different layer thickness is combined as the basic data and the differentiated waveform for detection of the layer thickness is calculated is described. In the differentiated waveform comparator 15, the pattern data value DBi of the differentiated waveform data of the intensity having as a parameter the wavelength of the interference light from the layer to be processed in the plural layer structures having different thickness of the three or more undercoating oxide layers is compared with the real pattern of the differentiated waveform data obtained during the processing of the wafer 4 for production for fabricating the semiconductor device, so that the minimum residual σi and the differentiated waveform pattern DBi having the minimum data are obtained.

In the embodiment, the residual uses the magnitude of square error of time series data values as described below. The selector 18 selects two patterns in the ascending order from the minimum residual of the residuals σi.

The database composer 19 composes the combined pattern database DB from the combination coefficient α by the following expression (4). Here, the combination coefficient α can take a numerical value of 0 to 1.

$$BD=\alpha(t) \times DBj + (1-\alpha) \times DBk \quad (4)$$

Next, the pattern matching comparator 20 compares the combined pattern database with the real pattern. The calculator 21 selects the combination coefficient α that the residual σ is minimum while changing the combination coefficient α in the range of 0 to 1 so as to make the residual σ smaller.

The combined pattern database that the residual σ obtained when the combination coefficient is selected is minimum is used to calculate the remaining layer thickness of the polysilicon layer at the current time (any time) during processing as the instantaneous layer thickness and the data of this value is stored in the remaining layer thickness time series data recorder 22. The regression analyzer 23 uses the remaining layer thicknesses (instantaneous layer thicknesses) at the current time and the plural past times recorded in the remaining layer thickness time series data recorder 22 and calculates the current remaining layer thickness as the calculated layer thickness by regression calculation.

The remaining layer thickness as a result of calculation by the regression calculation is transmitted to the end judgment device 24, which compares the previously set target remaining layer thickness with the current remaining layer thickness (calculation) to judge whether the target remaining layer thickness is smaller than or equal to the current remaining layer thickness (calculation). When it is judged that the current remaining layer thickness is smaller than or equal to the target remaining layer thickness, it is judged that the etching amount of the layer to be processed reaches the predetermined value and an instruction for ending the etching processing is transmitted to the plasma processing apparatus 1. Further, the judgment result is transmitted to the display unit 25 and displayed in the display unit 25 having liquid crystal or CRT to be informed to the user. Moreover, information of operation, abnormality in operation and error of operation is also displayed in the display unit 25.

Figure 4:
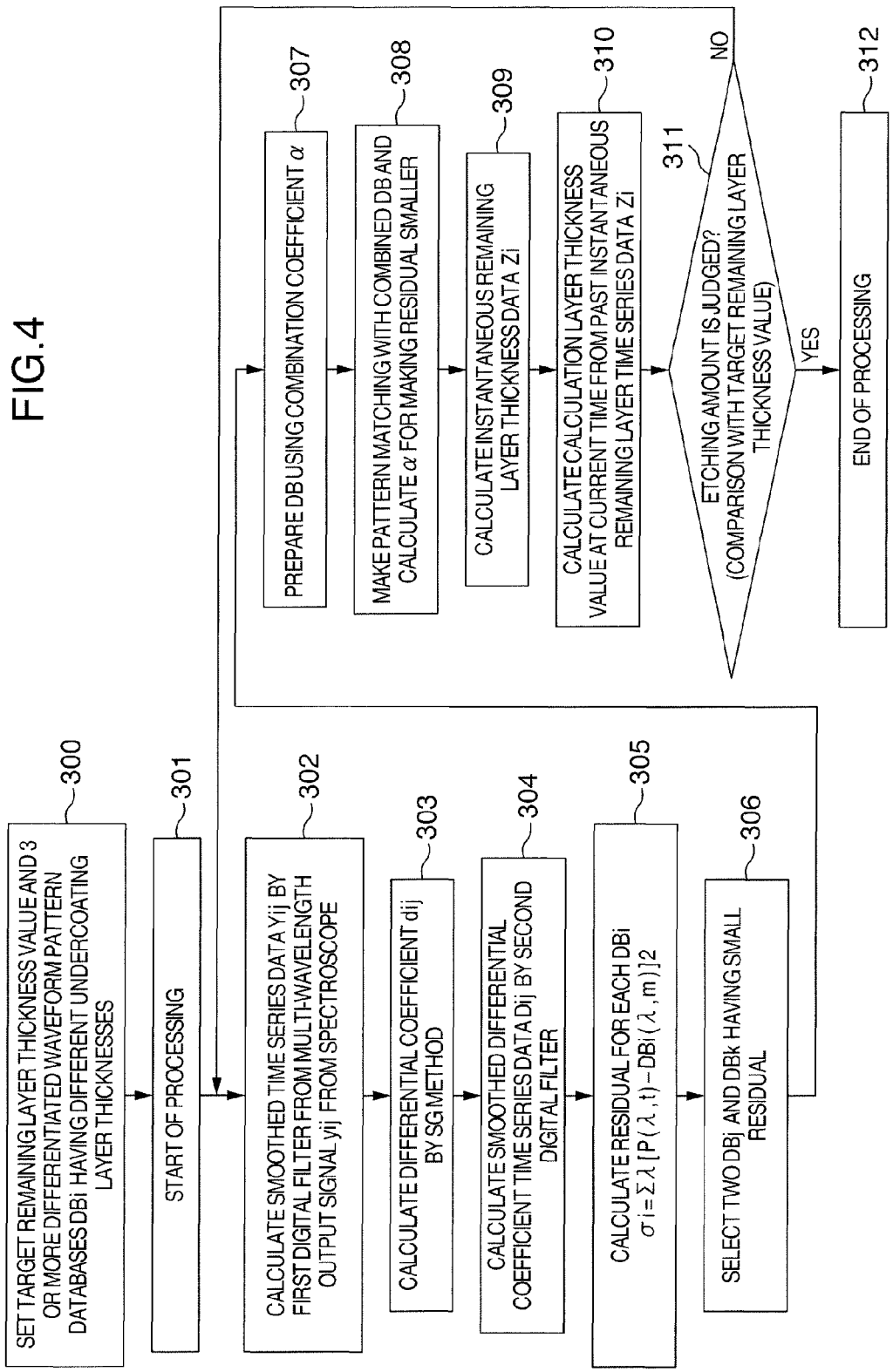
FIG. 4 is a flow chart showing an operation flow of detecting an etching amount of the plasma processing apparatus according to the first embodiment shown in FIG. 1.

Referring now to the flow chart of FIG. 4, the procedure of calculating the etching amount of the layer to be processed in case where the etching processing is performed by the etching amount detection device 9 of FIG. 1 is described. FIG. 4 is a flow chart showing the operation flow of detecting the etching amount by the plasma processing apparatus according to the embodiment shown in FIG. 1. The operation flow of the etching amount detection device 9 is mainly shown.

In the embodiment, a target remaining layer thickness value of the polysilicon layer 201 which is the layer to be processed and the pattern data stored in the differentiated waveform pattern database 16 and used for detection or judgment of the thickness value are set in advance of the processing of the wafer 4 (step 300). As the pattern data selected by the 3 or more differentiated waveform pattern databases, 3 or more undercoating oxide layers 202 having different layer thickness are selected to be set. Further, the target layer thickness of the polysilicon layer 210 to be processed is set and stored in the storage unit within the etching amount detection device 9.

Next, the processing of the wafer 4 is started in the vacuum processing chamber 2 and sampling (for example, at intervals of 0.1 to 0.5 second) of the interference light from the surface of the wafer 4 obtained during the processing is started (step 301). At this time, a sampling start instruction is issued in response to the start of the etching processing. The intensity of the interference light of multi-wavelength from the layer to be processed changed in accordance with the etching of the layer structure on the wafer advanced with change in time after start is transmitted to the spectroscope 10 of the etching amount detection device 9 every time after start of the processing and is detected as the light detection signal of voltage in accordance with the intensity of light for each predetermined frequency by the light detection device to be outputted.

For example, the light detection signal of the processing spectroscope 10 which has detected the interference light from the inside of the vacuum processing chamber 2 at any time t after the start of processing is converted into a digital signal and a sampling signal yij as the data signal associated with the any time t is obtained. Next, the multi-wavelength output signal yij from the spectroscope 10 is smoothed by the first digital filter circuit 12 and the time series data Yij at any time is calculated (step 302).

Next, the time series data Yij is transmitted to the differentiator 13, in which the differential coefficient dij of the time series is calculated by the S-G method (Savitzky-Golay method) (step 303). That is, the coefficient (primary or secondary) of signal waveform is detected by the differentiation processing (S-G method).

The differential coefficient dij is transmitted to the second digital filter 14 and the smoothed differential coefficient time series data Dij (P) is calculated (step 304). The obtained smoothed differential coefficient time series data Dij (P) is transmitted to the differentiated waveform comparator 15.

The differentiated waveform comparator 15 compares three or more differentiated waveform pattern data stored previously in the differentiated waveform pattern database 16 with the calculated smoothed differential coefficient time series data Dij (P) transmitted to the differential coefficient comparator 15 to calculate the residual $\sigma i = ROOT(\Sigma(P-DBi)2/j)$, which is transmitted to the residual calculator 17. (ROOT( ) means square root of ( ).) The residual calculator 17 selects two differentiated waveform pattern data DBj and DBk in the ascending order from the minimum of the residual n and transmits the selected data to the combined database composer 19 (step 306).

In the combined database composer 19 of the embodiment, the two received differentiated waveform pattern data DBj and DBk are combined using the combination coefficient $\alpha(t)$ having plural values between 0 and 1 to compose the combined database DB (step 307). Pattern matching between the combined database DB and the real pattern data which is the differentiated waveform pattern obtained from the smoothed differential coefficient time series data P composed in step 304 is made using $\alpha(t)$ as a parameter.

Here, the combination coefficient $\alpha(t)$ having the minimum residual is calculated by the combination coefficient calculator 21 (step 308). The remaining layer thickness corresponding to the combination pattern database is calculated as the instantaneous layer thickness data Zi at the any time (current time) t (step 309) and is transmitted to the remaining layer thickness time series data recorder 22 to be stored.

Furthermore, the instantaneous layer thickness time series data Zi recorded in the remaining layer thickness time series data recorder 22 and the instantaneous layer thickness time series data Zi at plural past times during processing are used to calculate the current calculated layer thickness by the regression analyzer 23 and store it in storage measures such as RAM and ROM within the calculated layer thickness time series data recorder not shown in the etching amount detection device 9 (step 310). That is, the primary regression linear line $Y = Xa \cdot t + Xb$ (Y: remaining layer amount, t: etching time, Xa: absolute value of Xa is etching rate, Xb: initial layer thickness) is calculated by the regression analyzer 23 and the etching amount (or remaining layer amount) at current time is calculated from the regression linear line to be stored in the storage unit.

Further, in step 309, when the residual between the real pattern and the combined differentiated waveform pattern data is larger than or equal to the threshold value for sectioning the predetermined permission range as a result of comparison, it is judged to be improper as data for judging the layer thickness and the layer thickness corresponding to the combined differentiated waveform pattern data having the minimum residual can be left without storing it in the remaining layer thickness time series data recorder 22 as the instantaneous layer thickness data Zi at the current time. Further, calculation of the regression analyzer 23 in step 310 may be made as the instantaneous layer thickness Zi at the current time instead of the regression calculated data and the instantaneous layer thickness data Zi at the past time (for example, sampling time just before the current time) during processing before any time t.

Next, the layer thickness calculated as the current remaining layer thickness of the layer to be processed is compared with the previously set target remaining layer thickness (set in step 300) (step 311). In this step, when it is judged that the layer thickness calculated in step 310 is smaller than or equal to the target remaining layer thickness, it is judged that the target is reached and the processing proceeds to step 312, in which a signal for ending the etching processing is transmitted to the plasma processing apparatus 1 (step 312). Finally, setting for the end of sampling is made.

When it is judged that the target is not reached, the processing is returned to the processing in step 302. When it is judged that the target is reached in step 311, not only is the etching processing controlled to be ended, but also a command may be issued to the plasma processing apparatus 1 so as to make the etching processing in a next step. For example, when over-etching processing in which the processing rate is reduced is made or the layer to be etched includes plural layers, operation conditions of the plasma processing apparatus 1 may be changed to fit the lower layer and the processing may be performed.

Figure 5:
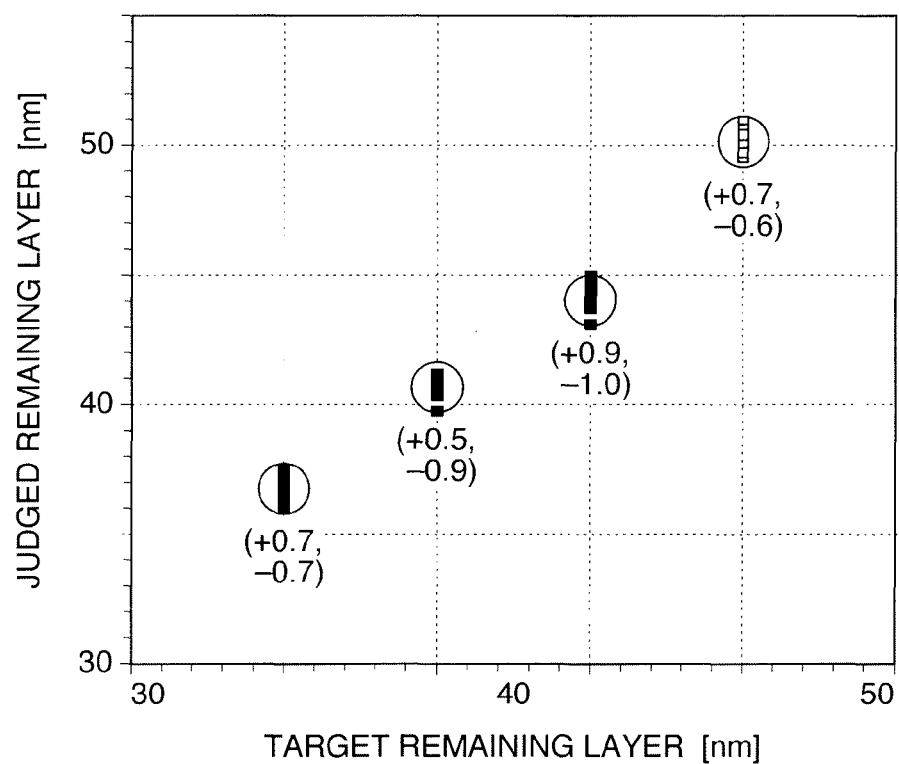
FIG. 5 is a graph showing an implementation result of wafers subjected to etching processing in the first embodiment shown in FIG. 1.

FIG. 5 shows the effect of the embodiment. FIG. 5 is a graph showing the effect of a wafer which has been etched in the embodiment shown in FIG. 1.

In FIG. 5, the effect in case where wafers having the thickness of the undercoating oxide layers of 45 nm to 77 nm (4 pieces for each of 4 kinds) have been etched is shown. The horizontal axis of FIG. 5 shows a set target remaining layer and the vertical axis shows a remaining layer judged for the target remaining layer. The judgment accuracy for the undercoating oxide layers is within ±1 nm and it is shown that high-accurate judgment could be made.

Further, as described above, since the sufficient judgment accuracy can be satisfied and information of the undercoating oxide layer thickness of the etched wafers can be obtained, the plasma processing apparatus can be used even for production management of the undercoating oxide layer thickness.

Figure 6:
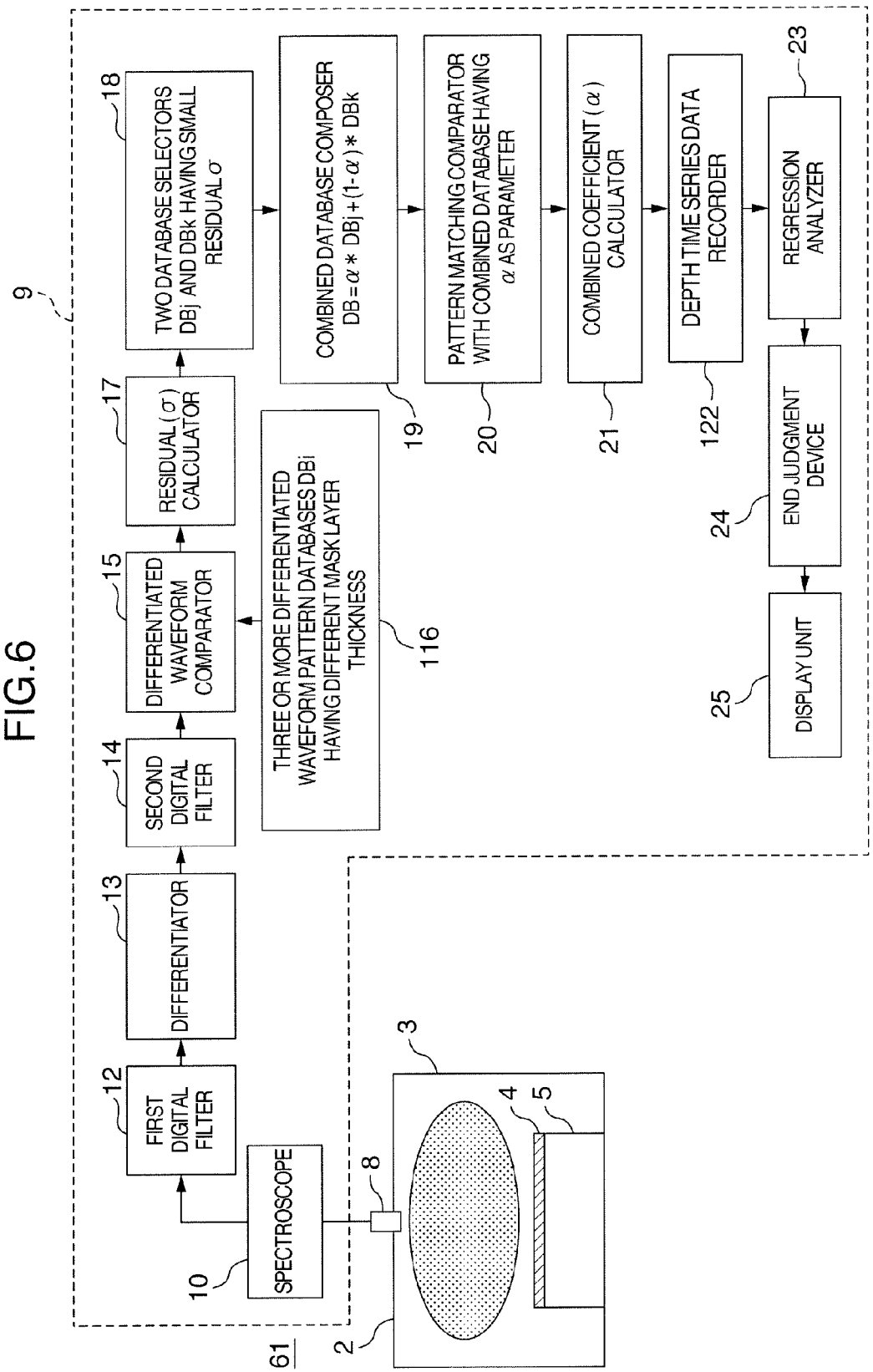
FIG. 6 is a diagram schematically illustrating a plasma processing apparatus according to a second embodiment of the present invention.

FIG. 6 is a longitudinal sectional view schematically illustrating a plasma processing apparatus according to a modification example of the embodiment of the present invention. The plasma processing apparatus 61 of this example includes the vacuum container 2 and a depth monitoring device 9 in the same manner as the above embodiment.

The modification example is different from the embodiment shown in FIG. 1 in that the modification example includes three or more differentiated waveform databases 116 having different mask layer thickness as the differentiated waveform database and further includes a depth time series data recorder 122 instead of the remaining layer thickness time series data recorder 22. Other configuration is the same as that of FIG. 1 and performs the same operation.

Figure 7:
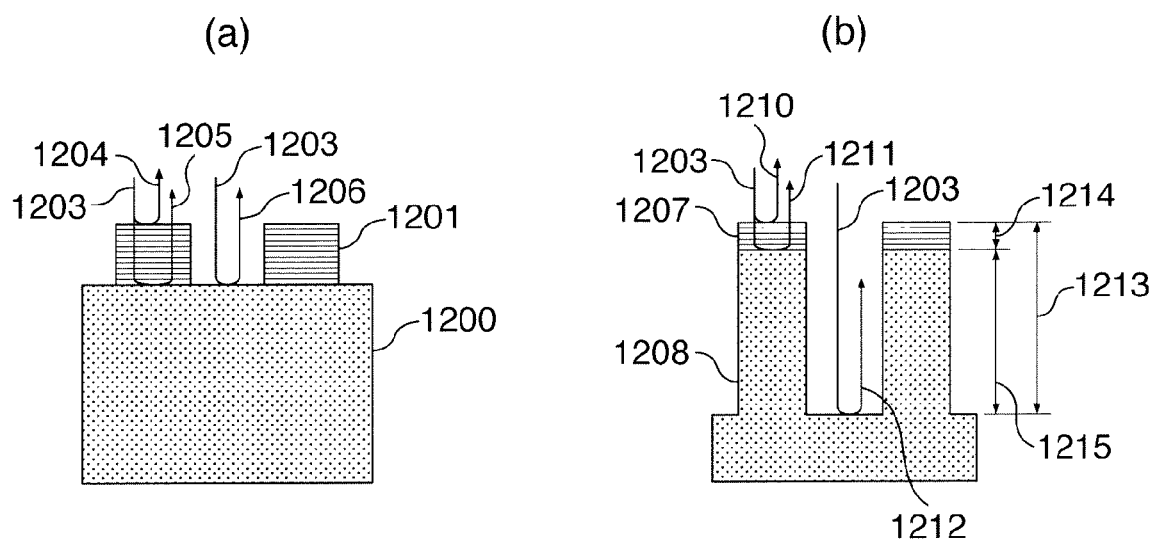
FIG. 7(a)-(b) is longitudinal sectional views schematically illustrating layer structure to be processed by the plasma processing apparatus according to the second embodiment shown in FIG. 6.

FIG. 7 is longitudinal sectional views schematically illustrating the layer structure formed previously on a wafer to be processed in the modification example shown in FIG. 6. (a) of FIG. 7 schematically illustrates the layer structure having a mask layer 1201 and a silicon layer 1200 formed just after the beginning of the etching processing. (b) of FIG. 7 schematically illustrates the layer structure having a mask layer 1207 and a silicon layer 1208 formed after plasma processing in the plasma processing apparatus 1 of FIG. 1.

When plasma emitted light 1203 is incident on the wafer of (a) of FIG. 7 just after the beginning of the etching processing, reflected light 1204 by the surface of the mask layer 1201, reflected light 1205 by the boundary between the mask layer 1201 and the silicon layer 1200 and reflected light 1206 by the surface of the silicon layer 1202 are produced.

Further, when plasma emitted light 1203 is incident on the wafer of (b) of FIG. 7 during the etching processing, reflected light 1210 by the surface of the mask layer 1207, reflected light 1211 by the boundary between the mask layer 1207 and the silicon layer 1208 and reflected light 1212 by the surface of the silicon layer 1208 are produced. In (b) of FIG. 7, a step value 1213 is VS, a mask thickness 1214 is VM and a depth value 1215 is VD.

Figure 8:
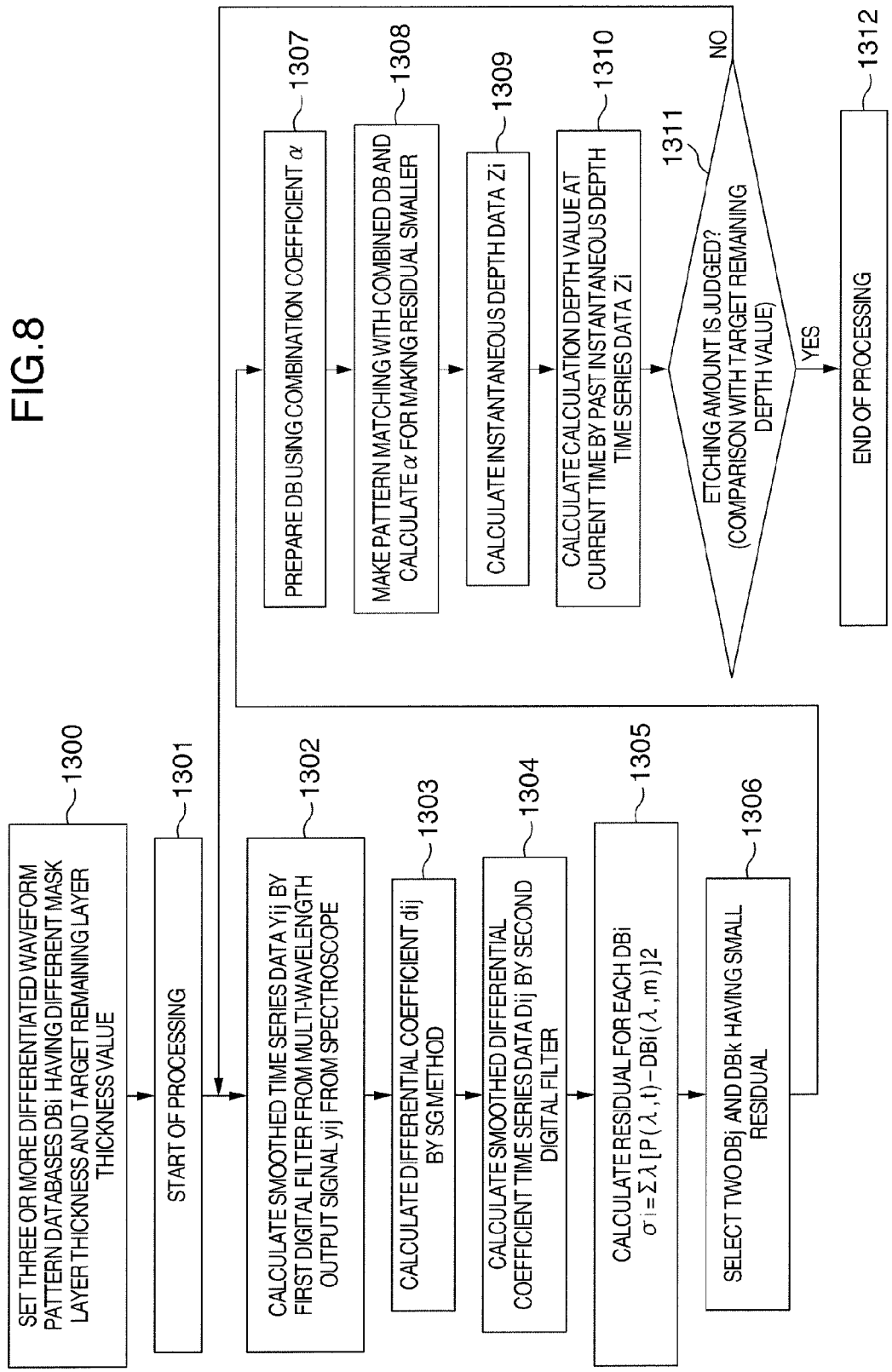
FIG. 8 is a flow chart showing a processing flow performed by the plasma processing apparatus according to the second embodiment shown in FIG. 6.

Referring now to the flow chart of FIG. 8, the procedure of calculating the etching amount of the layer to be processed in case where the etching processing is performed by the etching amount detection device 9 of FIG. 6 is described. FIG. 8 is the flow chart showing the operation flow of detecting the etching amount of the plasma processing apparatus according to the modification example shown in FIG. 6. The flow chart shows the procedure of judging the depth of grooves or holes formed in the polysilicon layer 1202 which is the layer to be processed using the mask layer 1201 as a mask when the wafer 4 having the surface on which the layer structure including the mask layer 1201 shown in FIG. 7 and the silicon layer 1200 disposed under the mask layer is previously formed is etched using plasma and mainly shows the operation flow of the etching amount detection device 9.

In the embodiment, in advance of the processing of the wafer 4, data of patterns of differentiated values (differentiated waveform patterns) of the intensity having as a parameter the wavelength of the interference light obtained from the layer structure in case where the layer structure including the silicon layer 1200 which is the layer to be processed and three or more mask layers having different layer thickness is etched are set in the differentiated waveform pattern database 116 as data DBi (step 1300). Further, a target depth value of the silicon layer is stored in the storage unit in the etching amount detection device 9 to be held.

Next, processing of the wafer 4 is started in the vacuum processing chamber 2 and sampling (for example, at intervals of 0.1 to 0.5 second) of the interference light from the surface of the wafer 4 obtained during the processing is started (step 1301). At this time, a sampling start instruction is issued with the start of the etching processing. The intensity of the interference light of multi-wavelength from the layer to be processed changed in accordance with the etching of the layer structure on the wafer proceeding with change in time after the start is transmitted to the spectroscope 10 of the etching amount detection device 9 every time after the start of processing and is detected by the light detector as a light detection signal of voltage according to the intensity of light every predetermined frequency to be outputted.

For example, the light detection signal of the processing spectroscope 10 which has detected the interference light from the vacuum processing chamber 2 at any time t after the beginning of the processing is converted into a digital signal to obtain a sampling signal yij as the data signal associated with the any time t. Next, the multi-wavelength output signal yij from the spectroscope 10 is smoothed by the first digital filter circuit 12 and the time series data Yij at any time is calculated (step 1302).

Next, the time series data Yij is transmitted to the differentiator 13 to calculate the differential coefficient dij of time series by means of S-G method (Savitzky-Golay method) (step 1303). That is, the coefficient (primary or secondary) di of the signal waveform is detected by the differentiation processing (S-G method).

The differential coefficient dij is transmitted to the second digital filter circuit 14, in which the smoothed differential coefficient time series data Dij (P) is calculated (step 1304). The obtained smoothed differential coefficient time series data Dij (P) is transmitted to the differentiated waveform comparator 15.

The differentiated waveform comparator 15 compares data of three or more differentiated waveform patterns previously stored in the differentiated waveform pattern database 16 with the smoothed differential coefficient time series data Dij (P) transmitted to the differentiated waveform comparator 15 and calculates the residual σi=ROOT(Σ(P−DBi)2/j), which is transmitted to the residual calculator 17. (ROOT( ) means square root of ( ).) The residual calculator 17 selects two differentiated waveform pattern data DBj and DBk in the ascending order from the minimum of the residual σ and transmits the selected data to the combined database composer 19 (step 1306).

The combined database composer 19 of the embodiment combines the two received differentiated waveform pattern data DBj and DBk using the combination coefficient α(t) having plural values between 0 and 1 to compose the combined database DB (step 1307). Pattern matching of the combined database DB with the real pattern data which is the differentiated waveform pattern obtained from the smoothed differential coefficient time series data P composed in step 304 is made using α(t) as a parameter.

Here, the combination coefficient α(t) having the minimum residual is calculated by the combined coefficient calculator 21 (step 1308). The etching depth value of the silicon layer 1202 corresponding to the combined pattern database is calculated as the instantaneous depth data Zi at the any time (current time) t (step 1309) and transmitted to the depth time series data recorder 122 to be stored.

Furthermore, the instantaneous depth time series data Zi recorded in the depth time series data recorder 122 and the instantaneous depth time series data Zi at plural past times during processing are used to calculate the current calculation depth value by the regression analyzer 23 and store it in the storage measure such as RAM and ROM in the calculation depth time series data recorder not shown within the etching amount detection device 9 (step 1310). That is, a primary regression linear line Y=Xa·t+Xb (Y: remaining layer amount, t: etching time, Xa: absolute value of Xa is an etching rate and Xb: initial layer thickness) is obtained by calculation of the regression analyzer 23 and the etching mount (or depth amount) at current time is calculated from the regression linear line, so that data shown by this etching amount is stored in the storage unit.

Further, in step 1309, when the residual between the real pattern and the combined differentiated waveform pattern data is larger than or equal to the threshold value for sectioning the predetermined permission range as a result of comparison, it is judged to be improper as data for judging the depth and the depth corresponding to the combined differentiated waveform pattern data having the minimum residual can be left without storing it in the depth time series data recorder 22 as the instantaneous depth data Zi at the current time. Further, calculation of the regression analyzer 23 in step 1310 may be made as the instantaneous depth Zi at the current time instead of the regression calculated data and the instantaneous depth data Zi at the past time (for example, sampling time just before the current time) before any time t during processing.

Next, the calculation depth value as the depth amount of the current calculated layer to be processed is compared with the previously set target depth value (set in step 1300) (step 1311). In this step, when it is judged that the layer thickness value calculated in step 310 is smaller than or equal to the target remaining layer thickness value, it is judged that the target is reached and the processing proceeds to step 1312, in which a signal for ending the etching processing is issued to the plasma processing apparatus 61 (step 1312). Finally, setting for the end of sampling is made.

When it is judged that the target is not reached, the processing is returned to the processing in step 1302. When it is judged that the target is reached in step 1311, not only is the control for ending the etching processing performed but also an instruction may be issued to the plasma processing apparatus 1 so as to perform the etching processing in the next step. For example, when the over-etching processing in which the processing rate is reduced is performed or the layer to be etched is formed of plural layers, the operation condition of the plasma processing apparatus 61 may be changed to be suitable for the remaining layer amount of the mask and the processing having the changed operation condition may be performed.

FIG. 9 is graphs showing differentiated waveform patterns obtained when the wafer having the layer structure shown in FIG. 7 is etched using the plasma processing apparatus according to the modification example shown in FIG. 6. Patterns of three graphs in FIG. 9 show the differentiated waveform patterns in which the magnitude of differentiated values of intensity is expressed by shading while using as a parameter the wavelength of the interference light obtained from the surface of the layer structure during processing. In FIG. 9, the vertical axis represents wavelength and the horizontal axis represents time after the beginning of processing (this is a value equal to the remaining layer thickness value during processing or resembling the remaining layer thickness value to the degree regarded as the equal value).

(a) of FIG. 9 shows a differentiated waveform pattern (theoretical differentiated waveform pattern) of the intensity having as a parameter the wavelength of the interference light from the mask layer calculated theoretically. (b) of FIG. 9 shows a differentiated waveform pattern (real differentiated waveform pattern) of the intensity having as a parameter the wavelength of the interference light from the surface obtained when the wafer having the layer structure shown in FIG. 7 on the surface is etched actually.

Further, in (b) of FIG. 9, 1507 and 1508 represent components of waveform according to the interference light from the step produced by etching of silicon in the real differentiated waveform pattern and 1509 and 1510 represent components of change in the intensity of the interference light generated by reducing the remaining thickness of the mask layer with progress of the etching processing in the real differentiated waveform pattern. (c) of FIG. 9 shows data obtained by reducing data of the patterns of (a) of FIG. 9 at the ratio corresponding to the opening ratio of the wafer from the data corresponding to the pair of time and wavelength of the pattern of (b) of FIG. 9 and has the horizontal axis representing time and the vertical axis representing wavelength. (c) of FIG. 9 shows the differentiated waveform pattern (real step differentiated waveform pattern) of the intensity having as a parameter the wavelength of the interference light from the layer to be processed having the remaining layer thickness changed (that is, the depth of the step is changed) with the progress of the etching processing.

Description of the drawing is made by taking the real step interference waveform of (c) of FIG. 9 as an example. First, the definition expression of the optical path difference is represented by the following expression (14):

$$2dn/\cos\theta = m\lambda \qquad (14)$$

(m=0, 1, 2 . . . , that is, when m is an integer, the maximum value is obtained. Further, n is a refractive factor, θ is an incident angle and d is a layer thickness.)

The optical path difference by the step before etching processing is equal to the thickness of the mask layer. The optical path difference is increased since the thickness of the layer to be processed is reduced as the etching processing is advanced.

At this time, it is understood from the expression (14) that the optical path difference 2d which takes the maximum value depends on the wavelength (for simplification, it is assumed that θ=0). That is, since the period of the wavelength on the side of long wavelength is made longer as compared with the period of the wavelength on the side of short wavelength, it is understood that a positive differentiated value 1514, a differentiated value 1515 near zero and a negative differentiated value 1516 go down on the right side as the wavelength is made longer as shown in (c) of FIG. 9 showing the real step interference waveform.

In (a) of FIG. 9 showing the theoretical differentiated waveform pattern of the mask layer, the mask thickness is reduced with the progress of the etching processing inversely to the real step differentiated waveform pattern of the layer to be processed in (c) of FIG. 9. That is, the optical path differences are reduced. Accordingly, a positive differentiated value 1504, a differentiated value 1505 near zero and a negative differentiated value 1506 go up on the right side as the wavelength is made longer as shown in (a) of FIG. 9 showing the theoretical differentiated waveform pattern of the mask layer.

The real differentiated waveform pattern of (b) of FIG. 9 is the waveform obtained when the wafer of the layer structure shown in FIG. 7 is etched actually and is shown as the theoretical differentiated waveform pattern of the mask layer shown in (a) of FIG. 9 and the real step differentiated waveform pattern shown in (c) of FIG. 9 are superimposed on each other. Accordingly, data of the real step differentiated waveform pattern of the layer to be processed can be detected by reducing or removing data of the theoretical differentiated waveform pattern of the mask layer from data of the real differentiated waveform pattern obtained from the whole layer structure. Hereinafter, the structure for obtaining the theoretical differentiated waveform pattern of the mask layer is described.

FIG. 10 is a flow chart showing the operation flow of calculating the theoretical differentiated waveform pattern of the interference light from the mask layer and calculating the real step differentiated waveform pattern by reducing the data corresponding to the theoretical differentiated waveform pattern from the data of the real differentiated waveform pattern of the interference light from the layer structure.

After start of operation (step 1601), first, a test wafer having the surface on which the layer structure of the same structure as a product wafer to be processed is disposed is etched to obtain the real differentiated waveform pattern of the interference light from the layer structure (step 1602). Further, the initial mask layer thickness, the final (at end point of processing) mask layer thickness and the etching processing time t previously obtained of the test wafer which has been subjected to the etching processing actually are obtained to calculate the etching rate Rm from these data values (step 1603). Here, the etching rate Rm can be calculated by Rm=(initial mask layer thickness−final mask layer thickness)/t.

In other words, the initial layer thickness of the mask obtained before processing of the wafer, the interference waveform data obtained during the etching processing and the final layer thickness of the wafer obtained by measuring the wafer after processed by SEM can be used to calculate the etching rate from the reduction amount of the mask when the etching processing has been made and the etching processing time t.

Next, a value of the refractive index ni corresponding to the waveform $\lambda i$ of mask material is obtained from a literature in which physical properties and the like of the layer to be processed are described, for example, "Handbook of Optical Constants of Solids" (Edward D. Palic (Naval Research Laboratory Washington D.C.), Academic Press, Inc. 1985). The theoretical interference waveform Im of the mask layer of the test wafer is calculated from the obtained $\lambda i$ and ni, the etching rate Rm and the initial mask layer thickness obtained in step 1603 (step 1604). Such a theoretical interference waveform Im can be obtained using the heretofore known technique (for example, method using amplitude reflection coefficient of Fresnel). Step 1604 may be performed in advance of step 1602.

Next, data of the real step differentiated waveform pattern is calculated by reducing data corresponding to the theoretical differentiated waveform pattern of the mask layer of the layer structure of the test wafer obtained in step 1604 from the data of the real differentiated waveform pattern of the test wafer obtained in step 1602 (step 1605). When the theoretical differentiated waveform pattern of the mask layer is reduced from the real differentiated waveform pattern of the layer structure, for example, the opening ratio of the test wafer from which data of the real differentiated waveform pattern is obtained is used to decide the ratio of data of the reduced theoretical differentiated waveform pattern.

Furthermore, $\lambda i$, ni and Rm obtained in step 1604 are used to calculate the differentiated waveform pattern (theoretical differentiated waveform pattern) of the intensity having as a parameter the wavelength of the intensity of the interference light from plural (in the embodiment, 3 or more) mask layers having different initial thickness (step 1606). Moreover, the data of the real step differentiated waveform patterns obtained in step 1605 are superimposed on the corresponding data of the theoretical differentiated waveform patterns from the mask layer having plural layer thickness obtained in step 1606 to calculate differentiated waveform pattern DBi (step 1607) and the data are stored in the differentiated waveform pattern database 116 (step 1608). At this time, the data of the patterns DBi are stored in the storage unit such as ROM and RAM disposed in the etching amount detection device 9 or an external storage device such as DVD-ROM and hard disk.

As described above, even if the undercoating layer thickness and the initial thickness of the mask layer are scattered, the remaining layer thickness and the depth can be judged with accuracy and the yield of processing can be improved. Further, since information of the undercoating layer thickness and the mask layer thickness can be obtained accurately, the information can be utilized even to the production management of the undercoating layer thickness and the mask layer thickness.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method of processing a layer structure previously formed on an upper surface of a wafer disposed in a processing chamber within a vacuum container by means of plasma generated in the processing chamber, the layer structure including a layer to be processed and an undercoating layer disposed under the layer to be processed, the method comprising:
    calculating an etching amount of the layer to be processed at a time during processing of the wafer by using a result of comparing real pattern data which indicates a pattern of intensity of interference light having as a parameter a wavelength thereof obtained at a time during the processing of the wafer with detection pattern data obtained in advance by combining two patterns of data selected from three or more patterns of data each of which indicate the intensity of the interference light detected from a plurality of layer structures, wherein each said layer structure contains said undercoating layer having a thickness which is different for each said layer structure; and
    judging arrival at a target of the processing of the layer to be processed using the etching amount.

2. The plasma processing method according to claim 1,
    Wherein, in the step of calculating the etching amount at the time during processing of the wafer by using the result of comparing the real pattern data with the detection pattern data combining two patterns of the intensities of the interference light, the two patterns are selected in ascending order of differences between the real pattern.

3. The plasma processing method according to claim 1,
    wherein, in the step of calculating the etching amount of the layer to be processed at the time during the processing of the wafer by using result of comparing the real pattern data with the detection pattern data, the real pattern data, or the three or more patterns of data from the two of which the detection pattern of data indicate time series data of differentiated values of intensities of the interference light having as a parameter the wavelength thereof detected from the layer structure during the processing of the wafer.

4. The plasma processing method according to claim 2, wherein, in the step of calculating an etching amount of the layer to be processed at the time during processing of the wafer by using result of comparing the real pattern data with the detection pattern data, the real pattern data, or the three or more patterns of data from the two of which the detection pattern of data indicate time series data of differentiated values of intensities of the interference light having as a parameter the wavelength thereof detected from the layer structure during the processing of the wafer.

5. The plasma processing method according to claim 1, further comprising:
   a step of using the calculated etching amount at the time during processing of the wafer and a previously stored etching amount at a time before to calculate the etching amount and to judge arrival at a target of the processing using the detected etching amount.

6. The plasma processing method according to claim 2, further comprising:
   a step of using the calculated etching amount at the time during processing of the wafer and a previously stored etching amount at a time before to calculate the etching amount and to judge arrival at a target of the processing using the detected the etching amount.

* * * * *